(12) United States Patent
Park

(10) Patent No.: US 8,222,628 B2
(45) Date of Patent: Jul. 17, 2012

(54) PHASE CHANGE MEMORY DEVICE HAVING A BOTTLENECK CONSTRICTION AND METHOD OF MANUFACTURING THE SAME

(75) Inventor: Nam Kyun Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 406 days.

(21) Appl. No.: 12/539,767

(22) Filed: Aug. 12, 2009

(65) Prior Publication Data

US 2010/0065805 A1   Mar. 18, 2010

(30) Foreign Application Priority Data

Sep. 18, 2008  (KR) .................. 10-2008-0091538

(51) Int. Cl.
*H01L 47/00* (2006.01)
(52) U.S. Cl. ......... 257/3; 257/4; 257/295; 257/E45.002; 438/409
(58) Field of Classification Search .................. 257/3, 4, 257/295, E45.002; 438/409
See application file for complete search history.

(56) References Cited

U.S. PATENT DOCUMENTS

| 7,067,837 | B2 * | 6/2006 | Hwang et al. ................. 257/3 |
| 2003/0052351 | A1 * | 3/2003 | Xu et al. ..................... 257/296 |
| 2010/0108974 | A1 * | 5/2010 | Park ............................. 257/3 |

FOREIGN PATENT DOCUMENTS

KR   1020060079455 A   7/2006

\* cited by examiner

*Primary Examiner* — Minh-Loan T Tran
(74) *Attorney, Agent, or Firm* — Ladas & Parry LLP

(57) ABSTRACT

A phase change memory device having a bottleneck constriction and method of making same are presented. The phase change memory device includes a semiconductor substrate, a lower electrode, an interlayer film, an insulator, a phase change layer and an upper electrode. The interlayer film is formed on the semiconductor substrate having the lower electrode. The interlayer film includes a laminate of a first insulating film, a silicon film and a second insulating film with a hole formed therethrough. The insulator is disposed along the exposed surface of the silicon film around the inner circumference of the hole. The phase change layer is embedded within the hole having the insulator which constricts the shape of the phase change layer to a bottleneck constriction. A method of manufacturing the phase change memory device is also provided.

34 Claims, 10 Drawing Sheets

PHASE CHANGE MEMORY DEVICE HAVING A BOTTLENECK CONSTRICTION AND METHOD OF MANUFACTURING THE SAME

CROSS REFERENCE TO RELATED APPLICATION

This application claims priority per Korean Patent Application No. 10-2008-0091538, filed on Sep. 18, 2008, which is incorporated herein by reference in its entirety.

BACKGROUND OF THE INVENTION

1. Field of the Invention

The present invention relates to a phase change memory device and a method of manufacturing the same, and more particularly, to a phase change memory device, which is capable of ensuring low reset current, and to a method of manufacturing the same.

2. Description of the Related Art

Recently, a considerable amount of research into the developing novel memory devices that have simple configurations which are capable of accomplishing a high level of integration while retaining the characteristics of a non-volatile memory device has been undertaken. One novel memory device that promises to satisfy the above critiques is the phase change memory device.

The phase change memory device is a memory device in which, based on the particular phase of a phase change layer interposed between a lower electrode and an upper electrode, logical information can be stored in these cells. These phase change memory devices often exploit a physical property difference, i.e., a change in the electrical resistance across the phase change layer as a function of which particular phase the phase change memory is at. A presently preferred phase change material reversibly exhibits transitioning between an ordered crystalline solid state to a disordered amorphous solid state in which the ordered crystalline solid state usually exhibits a lower electrical resistance than the disordered amorphous solid state. One can apply heat via an electrical current (i.e., Joule heat) through these phase change materials to drive the phase change transitions.

Also another important criteria in the successful development of these phase change memory devices should take into consideration the reducing or minimizing the reset current needed to convert the phase change layer in the crystalline state into the phase change layer in the amorphous state.

A typical technique used to reduce the reset current of the phase change memory device is to design as small as possible the contact interface between a phase change material and an electrode. One way to do this is to simply reduce the size of the electrode. However, since these types of memory devices are also subjected to the same ever increasing demands for providing higher and higher integration devices then the size of phase change memory devices is also expected to decrease along with decreasing the electrode area. Therefore there exist real physical limitations on how small the electrode can be fabricated brought about by limitations such as the resolution constraints of photolithography. Thus there are real physical limits on how small the electrodes can be made. Consequently, it becomes more and more difficult to ensure low reset current in highly integrated phase change memory devices.

Another technique of reducing the reset current of the phase change memory device is to embed the phase change material within a hole. Specifically, a phase change layer is provided in an embedded form, namely, a confined form. This method is advantageous because phase change occurs sequestered in the center of a small hole, and thus reset current may be ensured to be lower than when a phase change layer is provided in a patterned form. However, this method is also problematic because there exist physical limitations on how small of a size of the hole can be fabricated due to high integration demands of memory devices. Therefore, embedding the phase change material within a hole also makes it difficult to ensure low reset currents in high integration demands of memory devices.

SUMMARY OF THE INVENTION

Therefore, exemplary embodiments of the present invention provide a phase change memory device able to reduce the reset current necessary for phase change, and a method of manufacturing the same.

An embodiment of the present invention provides a phase change memory device, including a semiconductor substrate; a lower electrode formed on the semiconductor substrate; an interlayer film formed on the semiconductor substrate having the lower electrode and including a laminate of a first insulating film, a silicon film and a second insulating film, and a hole formed therethrough; an insulator disposed along the surface of the silicon film exposed by the hole; a phase change layer embedded in the hole having the insulator; and an upper electrode formed on the phase change layer.

The lower electrode may include any one selected from the group consisting of TiN, WN, MoN, NbN, TiSiN, TiAlN, TiBN, ZrSiN, WSiN, WBN, ZrAlN, TaSiN, TaAlN, Ti, W, Ta, Pt, TiSi, TaSi, TiW, TiAlON, WON, TaON and $IrO_2$.

The first insulating film may include any one selected from the group consisting of undoped silicate glass (USG), phosphorus silicate glass (PSG), boron phosphorus silicate glass (BPSG), spin on glass (SOG), tetra ethyl orthosilicate (TEOS), and high density plasma (HDP).

The second insulating film may include any one selected from the group consisting of USG, PSG, BPSG, SOG, TEOS and HDP.

The insulator may include a silicon oxide layer.

The phase change layer may be formed of a mixture or alloy containing one or more selected from the group consisting of Te, Se, Ge, Sb, Bi, Pb, Sn, As, S, Si, P and O.

The upper electrode may be formed of any one selected from the group consisting of TiN, TaN, WN, MoN, NbN, TiSiN, TiAlN, TiBN, ZrSiN, WSiN, WBN, ZrAlN, MoSiN, MoAlN, TaSiN, TaAlN, W, Ti, Mo, Ta, Pt, TiSi, TaSi, TiW, TiON, TiAlON, WON, TaON, and $IrO_2$.

Another aspect of the present invention provides a phase change memory device, including a semiconductor substrate; a lower electrode formed on the semiconductor substrate; an interlayer film formed on the semiconductor substrate having the lower electrode, and including a laminate of a first insulating film, a first silicon film, a second insulating film, a second silicon film and a third insulating film, and a hole formed therethrough; insulators disposed along the surface of the first silicon film and the surface of the second silicon film which are exposed by the hole; a phase change layer embedded in the hole having the insulators; and an upper electrode formed on the phase change layer.

The lower electrode may include any one selected from the group consisting of TiN, WN, MoN, NbN, TiSiN, TiAlN, TiBN, ZrSiN, WSiN, WBN, ZrAlN, TaSiN, TaAlN, Ti, W, Ta, Pt, TiSi, TaSi, TiW, TiAlON, WON, TaON and $IrO_2$.

The first insulating film may include any one selected from the group consisting of USG, PSG, BPSG, SOG, TEOS and HDP.

The second insulating film may include any one selected from the group consisting of USG, PSG, BPSG, SOG, TEOS and HDP.

The third insulating film may include any one selected from the group consisting of USG, PSG, BPSG, SOG, TEOS and HDP.

The insulators may include a silicon oxide layer.

The phase change layer may be formed of a mixture or alloy containing one or more selected from the group consisting of Te, Se, Ge, Sb, Bi, Pb, Sn, As, S, Si, P and O.

The upper electrode may be formed of any one selected from the group consisting of TiN, TaN, WN, MoN, NbN, TiSiN, TiAlN, TiBN, ZrSiN, WSiN, WBN, ZrAlN, MoSiN, MoAlN, TaSiN, TaAlN, W, Ti, Mo, Ta, Pt, TiSi, TaSi, TiW, TiON, TiAlON, WON, TaON, and $IrO_2$.

Another embodiment of the present invention provides a method of manufacturing the phase change memory device, including forming a nitride film on a semiconductor substrate; forming a lower electrode in the nitride film; laminating a first insulating film, a silicon film and a second insulating film on the nitride film having the lower electrode; etching the second insulating film, the silicon film and the first insulating film, thus forming a hole for exposing the surface of the lower electrode; subjecting the semiconductor substrate having the hole to oxidation, thus converting the surface of the silicon film exposed by the hole into a silicon oxide layer; forming a phase change layer to be embedded in the hole having the silicon oxide layer; and forming an upper electrode on the phase change layer.

The lower electrode may include any one selected from the group consisting of TiN, WN, MoN, NbN, TiSiN, TiAlN, TiBN, ZrSiN, WSiN, WBN, ZrAlN, TaSiN, TaAlN, Ti, W, Ta, Pt, TiSi, TaSi, TiW, TiAlON, WON, TaON and $IrO_2$.

The first insulating film may include any one selected from the group consisting of USG, PSG, BPSG, SOG, TEOS and HDP.

The second insulating film may include any one selected from the group consisting of USG, PSG, BPSG, SOG, TEOS and HDP.

The method may further include subjecting the semiconductor substrate having the hole to selective epitaxial growth, thus forming an epi-silicon layer on the surface of the silicon film, between forming the hole and converting the surface of the silicon film exposed by the hole into the silicon oxide layer.

The silicon oxide layer may be formed such that about 55~60% of a thickness thereof extends inside of the hole while about 40~45% of the thickness of thereof extends outside of the hole from the surface of the silicon film exposed by the hole.

The phase change layer may be formed of a mixture or alloy containing one or more selected from the group consisting of Te, Se, Ge, Sb, Bi, Pb, Sn, As, S, Si, P and O.

The phase change layer may be formed through any one selected from the group consisting of atomic layer deposition, chemical vapor deposition and selective growth.

The upper electrode may be formed using any one selected from the group consisting of TiN, TaN, WN, MoN, NbN, TiSiN, TiAlN, TiBN, ZrSiN, WSiN, WBN, ZrAlN, MoSiN, MoAlN, TaSiN, TaAlN, W, Ti, Me, Ta, Pt, TiSi, TaSi, TiW, TiON, TiAlON, WON, TaON, and $IrO_2$.

Still another embodiment of the present invention provides a method of manufacturing the phase change memory device, including forming a nitride film on a semiconductor substrate; forming a lower electrode in the nitride film; laminating a first insulating film, a first silicon film, a second insulating film, a second silicon film and a third insulating film on the nitride film having the lower electrode; etching the third insulating film, the second silicon film, the second insulating film, the first silicon film and the first insulating film, thus forming a hole for exposing the surface of the lower electrode; subjecting the semiconductor substrate having the hole to oxidation, thus converting the surface of the first silicon film and the surface of the second silicon film which are exposed by the hole into a silicon oxide layer; forming a phase change layer to be embedded in the hole having the silicon oxide layer; and forming an upper electrode on the phase change layer.

The lower electrode may include any one selected from the group consisting of TiN, WN, MoN, NbN, TiSiN, TiAlN, TiBN, ZrSiN, WSiN, WBN, ZrAlN, TaSiN, TaAlN, Ti, W, Ta, Pt, TiSi, TaSi, TiW, TiAlON, WON, TaON and $IrO_2$.

The first insulating film may include any one selected from the group consisting of USG, PSG, BPSG, SOG, TEOS and HDP.

The second insulating film may include any one selected from the group consisting of USG, PSG, BPSG, SOG, TEOS and HDP.

The third insulating film may include any one selected from the group consisting of USG, PSG, BPSG, SOG, TEOS and HDP.

The method may further include subjecting the semiconductor substrate having the hole to selective epitaxial growth, thus forming an epi-silicon layer on the surface of the first silicon film and the surface of the second silicon film, between forming the hole and converting the surface of the first silicon film and the surface of the second silicon film which are exposed by the hole into the silicon oxide layer.

The silicon oxide layer may be formed such that about 55~60% of a thickness thereof extends inside of the hole while about 40~45% of the thickness of thereof extends outside of the hole from the surface of the silicon film exposed by the hole.

The phase change layer may be formed of a mixture or alloy containing one or more selected from the group consisting of Te, Se, Ge, Sb, Bi, Pb, Sn, As, S, Si, P and O.

The phase change layer may be formed through any one selected from the group consisting of atomic layer deposition, chemical vapor deposition and selective growth.

The upper electrode may be formed of any one selected from the group consisting of TiN, TaN, WN, MoN, NbN, TiSiN, TiAlN, TiBN, ZrSiN, WSiN, WBN, ZrAlN, MoSiN, MoAlN, TaSiN, TaAlN, W, Ti, Me, Ta, Pt, TiSi, TaSi, TiW, TiON, TiAlON, WON, TaON, and $IrO_2$.

DESCRIPTION OF SPECIFIC EMBODIMENTS

Hereinafter, a detailed description will be given of embodiments of the present invention, with reference to the accompanying drawings. It is understood herein that the drawings are not necessarily to scale and in some instances proportions may have been exaggerated in order to more clearly depict certain features of the invention.

Figure 1:
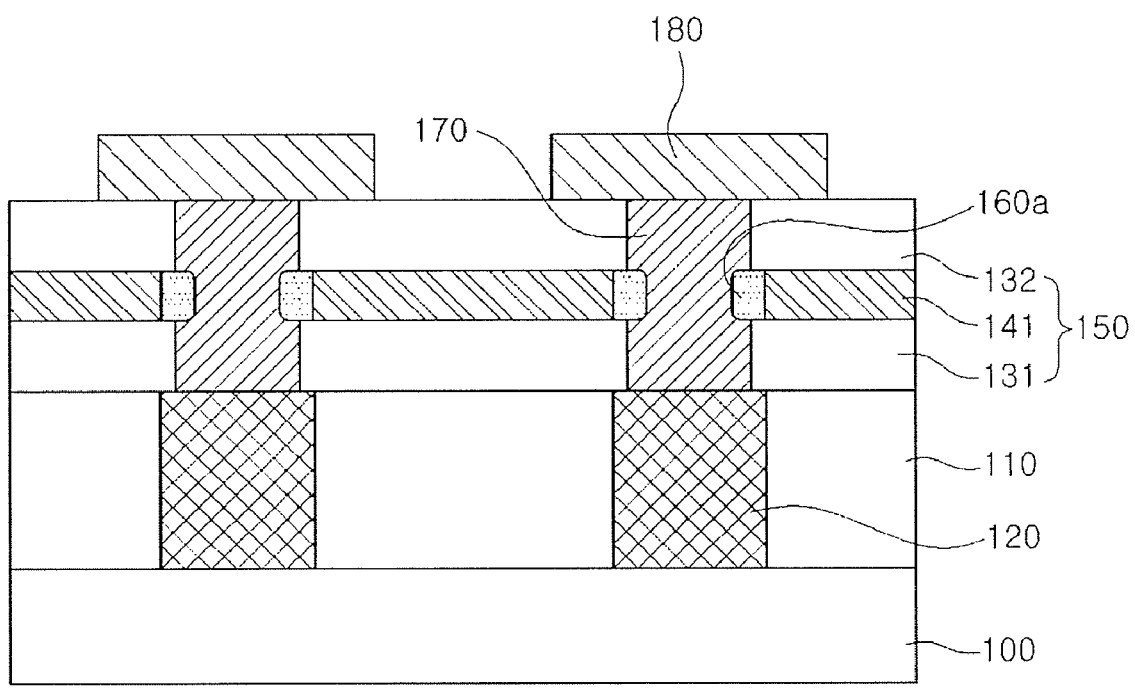
FIG. 1 is a cross-sectional view showing a phase change memory device according to a first embodiment of the present invention.

FIG. 1 is a cross-sectional view showing a phase change memory device according to a first embodiment of the present invention.

As shown in FIG. 1, provided on a semiconductor substrate 100 are lower electrodes 120 electrically connected to a switching device and a nitride film 110 for electrically insulating the lower electrodes 120. The lower electrodes 120 include any one selected from the group consisting of titanium nitride (TiN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), tantalum silicon nitride (TaSiN), tantalum aluminum nitride (TaAlN), titanium (Ti), tungsten (W), tantalum (Ta), platinum (Pt), titanium silicon (TiSi), tantalum silicon (TaSi), titanium tungsten (TiW), titanium aluminum oxynitride (TiAlON), tungsten oxynitride (WON), tantalum oxynitride (TaON) and iridium oxide ($IrO_2$).

Also provided on the semiconductor substrate 100 having the lower electrodes 120 is an interlayer film which includes a laminate of a first insulating film 131, a silicon film 141 and a second insulating film 132, and holes formed therethrough. Preferably, the interlayer film 150 includes the laminate of the first insulating film 131, the silicon film 141 and the second insulating film 132, in which the first insulating film 131 includes any one selected from the group consisting of undoped silicate glass (USG), phosphorus silicate glass (PSG), boron phosphorus silicate glass (BPSG), spin on glass (SOG), tetra ethyl orthosilicate (TEOS) and high density plasma (HDP), and the second insulating film 132 includes any one selected from the group consisting of USG, PSG, BPSG, SOG, TEOS and HDP. Also, an insulator 160a is disposed along the surface of the silicon film exposed by the holes. The insulator 160a includes for example a silicon oxide layer.

Also, a phase change layer 170 is embedded in the holes having the insulator 160a so that it is in contact with the lower electrodes 120. Preferably, the phase change layer 170 is formed of a mixture or alloy containing one or more selected from the group consisting of Te, Se, Ge, Sb, Bi, Pb, Sn, As, S, Si, P and O. Also, upper electrodes 180 are provided on the phase change layer 170. Preferably, the upper electrodes 180 are formed of any one selected from the group consisting of TiN, TaN, WN, MoN, NbN, TiSiN, TiAlN, TiBN, ZrSiN, WSiN, WBN, ZrAlN, MoSiN, MoAlN, TaSiN, TaAlN, W, Ti, Me, Ta, Pt, TiSi, TaSi, TiW, TiON, TiAlON, WON, TaON, and $IrO_2$.

The phase change memory device according to the first embodiment of the present invention is configured such that the insulator 160a including the silicon oxide layer is disposed on inner walls of the holes of the interlayer film 150 including the laminate of the first insulating film 131, the silicon film 141 and the second insulating film 132, and preferably, on the surface of the silicon film 141 of the inner walls of the holes thereof.

Thus, the phase change memory device according to the first embodiment of the present invention does not decrease the total critical dimension of the holes but rather selectively decreases only the critical dimension of the middle region of the holes brought about by forming the insulator 160a in the holes. As a result, a reduced reset current can be realized without decreasing the total critical dimension of the holes.

Specifically, in the phase change memory device configured such that the phase change layer is embedded in the holes, phase change occurs in the center of the holes, and thus, as the width of the holes where phase change occurs is narrowed, the reset current necessary for phase change is reduced. In the present invention, the insulator is disposed along the inner walls of the holes, and preferably, along the surface of the silicon film 141, thus forming bottlenecks in the holes, thereby reducing the width of the holes.

Therefore, in the phase change memory device according to the first embodiment of the present invention, the reset current can be further confined inside the holes upon phase change of the memory device, so that phase change can be realized at low reset current.

FIGS. 2A to 2E are cross-sectional views sequentially showing the process of manufacturing the phase change memory device according to the first embodiment of the present invention.

Figure 2A:
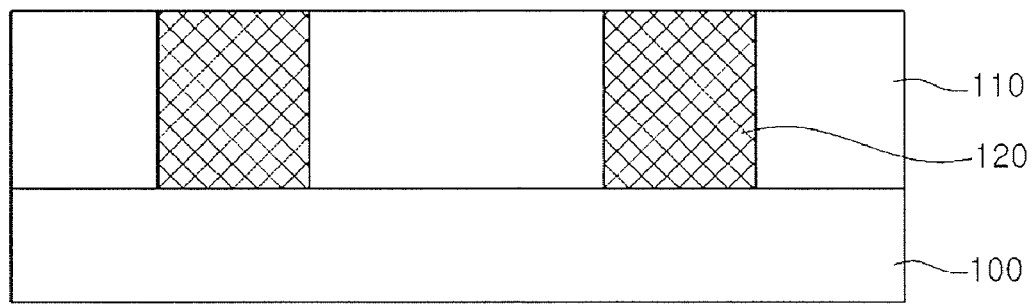
FIGS. 2A to 2E are cross-sectional views sequentially showing a process of manufacturing the phase change memory device according to the first embodiment of the present invention.

As shown in FIG. 2A, the semiconductor substrate 100 including a predetermined lower structure having a conductive pattern functioning as a switching device (not shown) is prepared, after which a nitride film 110 is formed on the semiconductor substrate 100. Subsequently, the nitride film 110 is selectively etched to form contact holes that expose the surface of the semiconductor substrate 100. The contact holes are then filled with a conductive material to thus form the lower electrodes 120. The lower electrodes 120 may be formed of any one selected from the group consisting of metals, alloys, metal oxynitrides, oxides and conductive carbon compounds, and preferably any one selected from the group consisting of TiN, WN, MoN, NbN, TiSiN, TiAlN, TiBN, ZrSiN, WSiN, WBN, ZrAlN, TaSiN, TaAlN, Ti, W, Ta, Pt, TiSi, TaSi, TiW, TiAlON, WON, TaON and $IrO_2$.

Figure 2B:
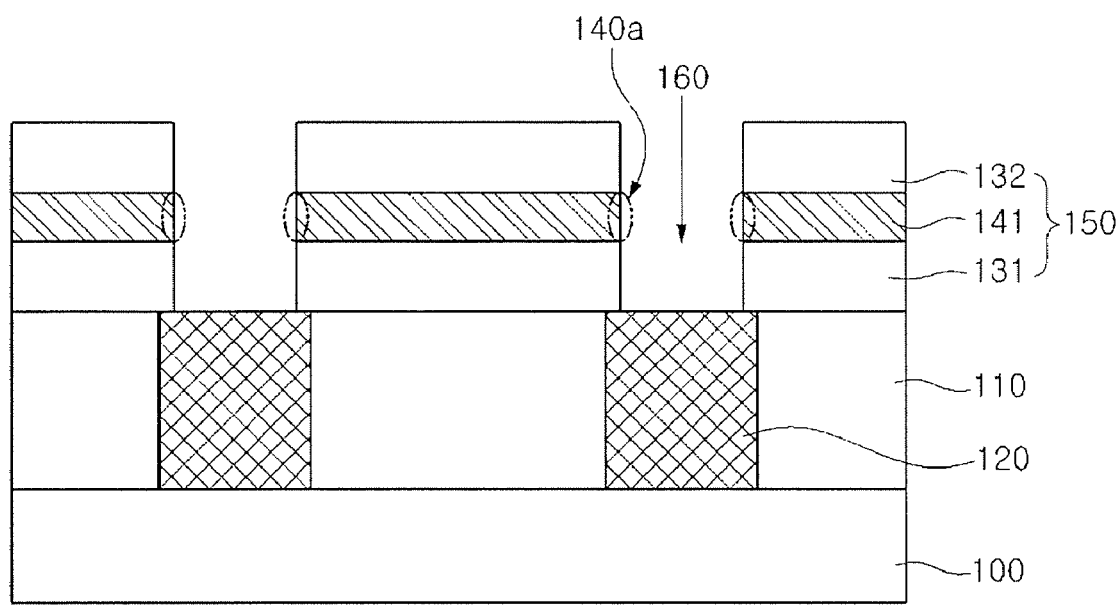

As shown in FIG. 2B, the first insulating film 131, the silicon film 141 and the second insulating film 132 are sequentially deposited, i.e., to form a laminate, over the nitride film 110 having the lower electrodes 120. This deposited laminate forms the interlayer film 150. Preferably, the first and second insulating films 131, 132 are preferably deposited with any one selected from the group consisting of USG, PSG, BPSG, SOG, TEOS and HDP. Subsequently, the second insulating film 132, the silicon film 141 and the first insulating film 131 are sequentially etched to form holes 160 that expose the surface of the lower electrodes 120. It is important to note that as the holes 160 are formed a surface 140a of the silicon film is exposed in the holes 160. The position of the holes 160 correspond to regions for forming the subsequent phase change layer.

Figure 2C:
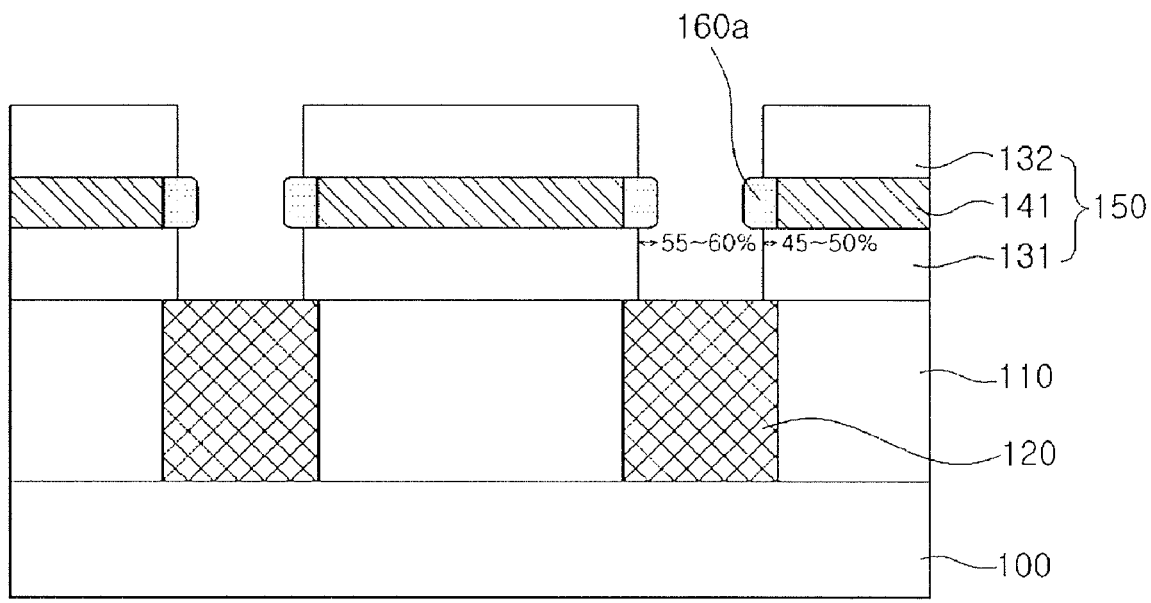

As shown in FIG. 2C, the semiconductor substrate having the holes 160 is subjected to a controlled oxidation process to oxidize the exposed surface 140a of the silicon film. It is important to note that volume expansion occurs at the surface 140a of the silicon film when undergoing the oxidation process when converting the exposed surface of the silicon film into a silicon oxide layer 160a. Preferably, the oxidation process is performed so that silicon oxide volume expansion occurs as much as about 55~60% inside of the holes (i.e., within the laminate of the interlayer film 150) and as much as about 40~45% outside within the confines of the holes from the exposed surface 140a of the silicon film.

The silicon oxide layer 160a formed through the oxidation process provides electrical insulation in the resultant to bottleneck shape along the middle region of the inner walls of the holes 160. In the present invention, the width of the holes, where phase change will eventually be deposited, becomes functionally reduced due to the growth brought about by oxidizing the exposed edge of the silicon film 141 into silicon oxide around the hole 160. Thereby this volumetric growth brought about by oxidation provides narrowing of an electrical pathway through the subsequently deposited phase change material in the hole 160 and thus ensuring a lower reset current.

Furthermore, because low reset current can be ensured without reducing the total critical dimension of the holes, then the reset current can be reduced without a need to limit an exposure process due to high integration demands of the device.

Moreover, because the holes can be formed without size limitations imposed by techniques such as photolithography, then a process of patterning the holes can be consistently and accurately carried out.

Figure 2D:
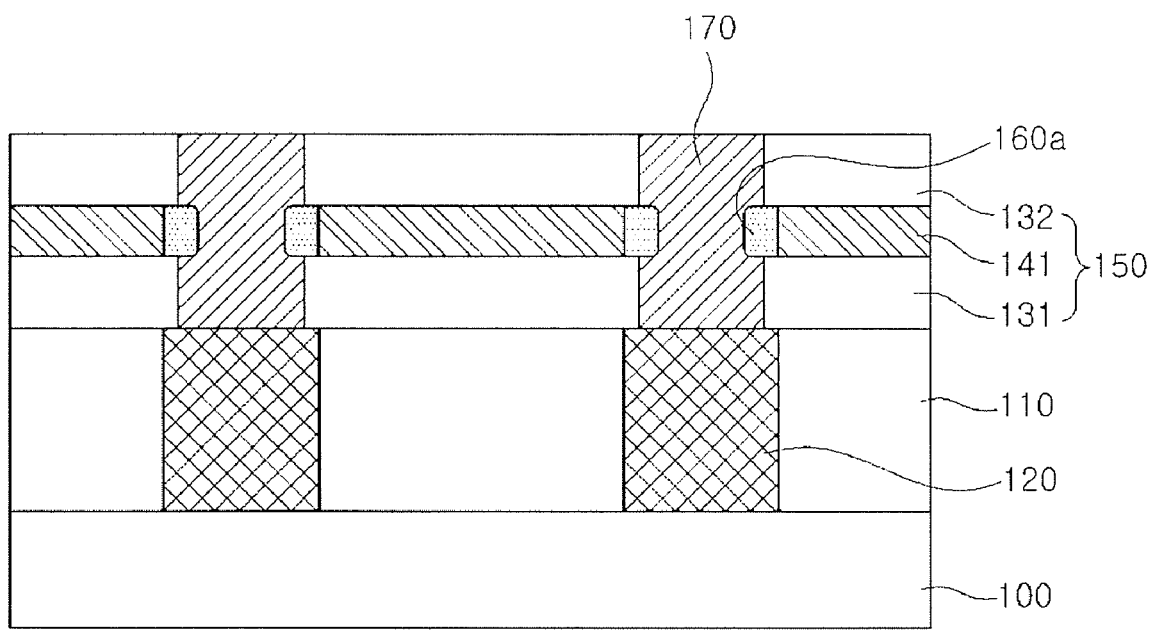

As shown in FIG. 2D, the phase change layer 170 is then embedded within the holes 160 that have the silicon oxide layer 160a. The phase change layer 170 is made of a mixture or alloy containing one or more selected from the group consisting of Te, Se, Ge, Sb, Bi, Pb, Sn, As, S, Si, P and O. Preferably, a ternary compound of Ge, Sb and Te or a quaternary compound of In, Sb, Te and Ag may be used. Also, the phase change layer 170 is embedded by using any known process such as those selected from the group consisting of atomic layer deposition (ALD), chemical vapor deposition (CVD) and selective growth.

Subsequently, the phase change layer 170 is subjected to a flattening process to expose the second insulating film 132. The flattening process may be conducted using chemical mechanical polishing (CMP) or etch-back techniques.

Figure 2E:
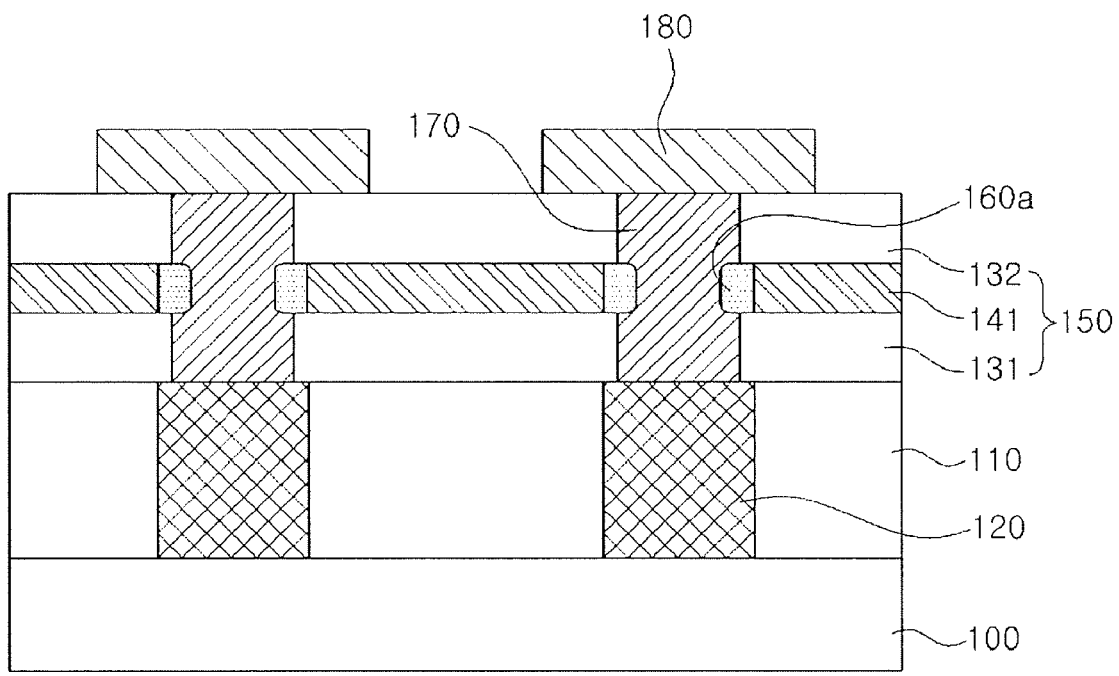

As shown in FIG. 2E, an upper electrode material is then deposited over the second insulating film 132 which has the phase change layer 170. After which the upper electrode material is selectively etched to form the upper electrodes 180 over the phase change layer 170. The upper electrodes 180 may be formed of any one selected from the group consisting of TiN, TaN, WN, MoN, NbN, TiSiN, TiAlN, TiBN, ZrSiN, WSiN, WBN, ZrAlN, MoSiN, MoAlN, TaSiN, TaAlN, W, Ti, Mo, Ta, Pt, TiSi, TaSi, TiW, TiON, TiAlON, WON, TaON, and $IrO_2$.

Although not shown, a series of subsequent procedures which are known in the art are sequentially performed, thus completing the phase change memory device according to the first embodiment of the present invention.

In the first embodiment of the present invention, the oxidation process is performed in a state in which the holes are already formed, so that the exposed surface of the silicon film is converted into the silicon oxide layer 160a to form the bottleneck insulator including the silicon oxide layer along the inner walls of the holes. In addition, according to a modification of the first embodiment, selective silicon epitaxial growth (SEG) may be performed to coat the holes with an epi-silicon layer on the exposed surface of the silicon film 141 in the holes 160 of interlayer film 150 laminate. After which the oxidation process may be performed, so that the epi-silicon layer is subsequently converted into the silicon oxide layer, thereby forming the bottleneck shaped insulator of the silicon oxide layer 160a along the inner walls of the holes 160.

Figure 3A:
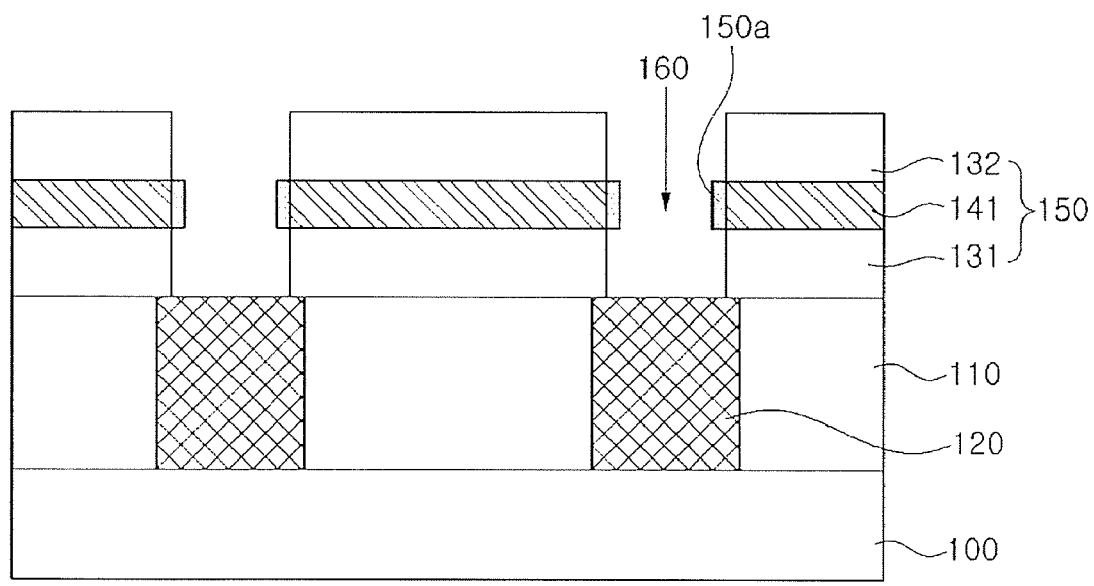
FIGS. 3A and 3B are cross-sectional views showing a process of manufacturing a phase change memory device according to a modification of the first embodiment of the present invention.
Figure 3B:
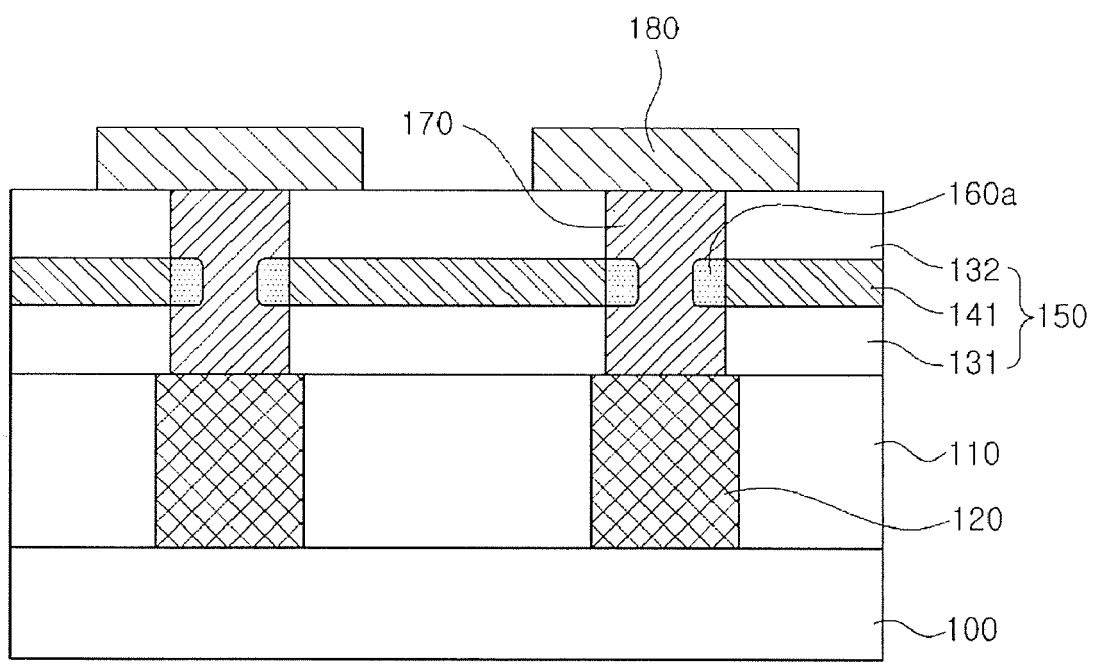

FIGS. 3A and 3B are cross-sectional views showing the process of manufacturing the phase change memory device according to the modification of the first embodiment of the present invention. In the modification of the first embodiment of the present invention, all of the process steps are performed in the same manner as in the first embodiment, with the exception that SEG for forming the epi-silicon layer is further carried out. Thus, a redundant description for the same elements is omitted, and the same elements are designated by the same names and reference numerals.

As shown in FIG. 3A, an interlayer film 150 is etched, thus forming holes 160, after which a semiconductor substrate having the holes 160 is subjected to SEG. While a silicon layer grows on the exposed surface of a silicon film upon SEG, an epi-silicon layer 150a is formed on the surface of the silicon film.

As shown in FIG. 3B, the semiconductor substrate having the epi-silicon layer 150a is subjected to an oxidation process. When the epi-silicon layer 150a is oxidized, the epi-silicon layer 150a is converted into a silicon oxide layer 160a.

Thereafter, a series of subsequent procedures including forming a phase change layer 170 and forming upper electrodes 180 are sequentially performed, thus completing the phase change memory device according to the modification of the first embodiment of the present invention.

In the modification of the first embodiment, the silicon oxide layer 160a is formed along the middle region of the inner walls of the holes 160 by using the SEG and oxidation process as detailed above, and thus, the bottlenecks of the holes may be formed to be much narrower than those of the first embodiment. Thereby, the width of the holes where phase change occurs can be further reduced, ultimately ensuring low reset current.

Figure 4:
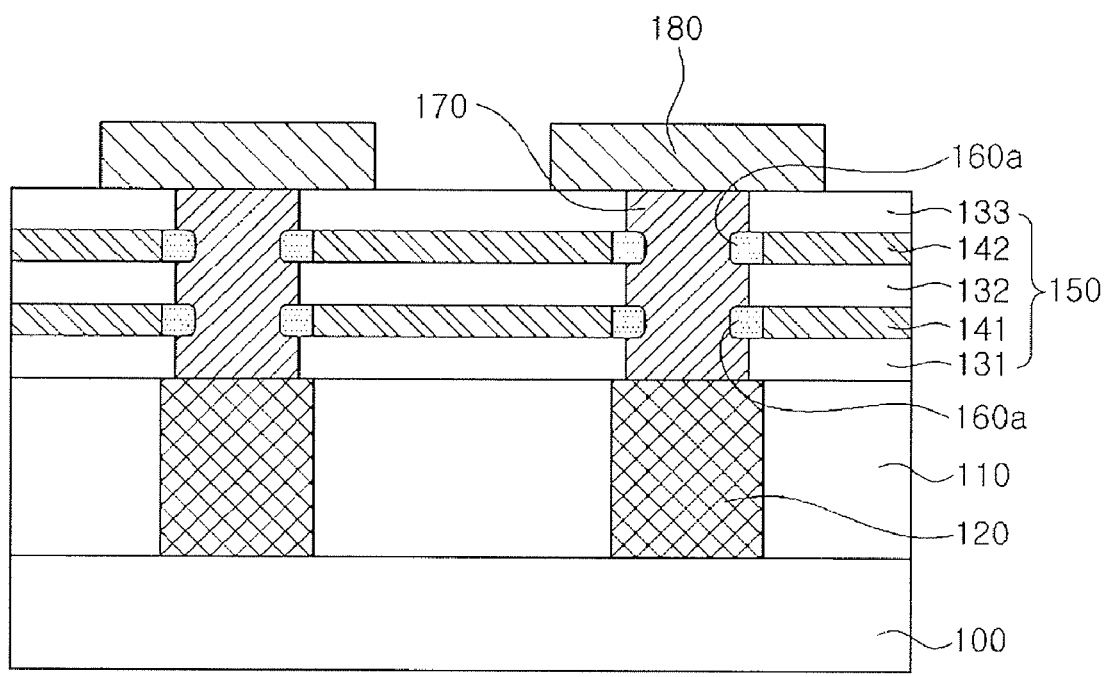
FIG. 4 is a cross-sectional view showing a phase change memory device according to a second embodiment of the present invention.

FIG. 4 is a cross-sectional view showing a phase change memory device according to yet another embodiment of the present invention. As shown in FIG. 4, provided on a semiconductor substrate 100 are lower electrodes 120 electrically connected to a switching device (not shown) and a nitride film 110 for electrically insulating the lower electrodes 120. Also provided on the semiconductor substrate 100 having the lower electrodes 120 is an interlayer film 150 which includes a laminate of a first insulating film 131, a first silicon film 141, a second insulating film 132, a second silicon film 142 and a third insulating film 133, and holes formed therethrough. Preferably, the first insulating film 131, the second insulating film 132 and the third insulating film 133 include any one selected from the group consisting of USG, PSG, BPSG, SOG, TEOS and HDP. Also, insulators 160a are disposed along the surfaces of the first and second silicon films 141, 142 exposed by the holes. The insulators 160a may be composed for example a silicon oxide layer.

A phase change layer 170 is shown embedded within the holes having the insulators 160a that contacts with the lower electrodes 120. Upper electrodes 180 are also provided over the phase change layer 170.

In the phase change memory device according to the second embodiment of the present invention, the insulators 160a composed of the silicon oxide layer are shown disposed along inner walls of the holes of the interlayer film 150 including the laminate of the first insulating film 131, the first silicon film 141, the second insulating film 132, the second silicon film 142 and the third insulating film 133. In this embodiment, the insulators 160a are preferably along the surfaces of the first and second silicon films 141, 142 of the inner walls of the holes thereof.

Hence, in the phase change memory device according to this embodiment of the present invention, the insulators are formed in the holes having the phase change layer, so that the width of the holes where phase change occurs can be reduced which ensures low reset current.

FIGS. 5A to 5E are cross-sectional views sequentially showing the process of manufacturing the phase change memory device according to the second embodiment of the present invention.

Figure 5A:
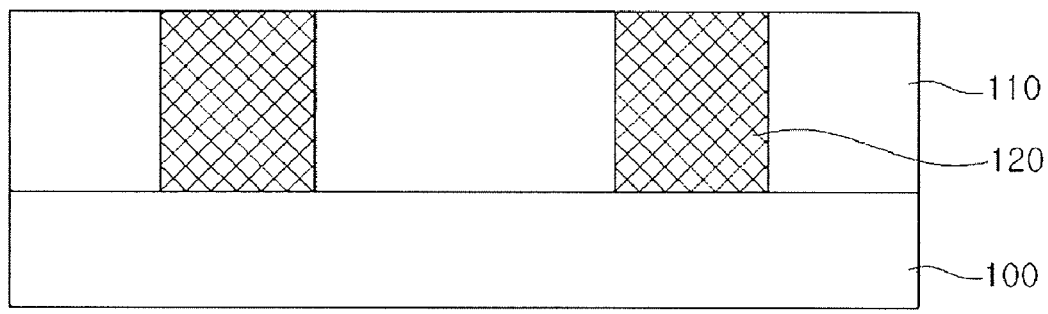
FIGS. 5A to 5E are cross-sectional views sequentially showing a process of manufacturing the phase change memory device according to the second embodiment of the present invention.

As shown in FIG. 5A, the semiconductor substrate 100 including a predetermined lower structure having a conductive pattern functioning as a switching device (not shown) is prepared, after which a nitride film 110 is formed on the semiconductor substrate 100. Subsequently, the nitride film 110 is selectively etched away to subsequently form contact holes that expose the surface of the semiconductor substrate 100. The contact holes are then filled in with a conductive material to form the lower electrodes 120. The lower electrodes 120 are formed of any one selected from the group consisting of metals, alloys, metal oxynitrides, oxides, and conductive carbon compounds, and preferably any one selected from the group consisting of TiN, WN, MoN, NbN, TiSiN, TiAlN, TiBN, ZrSiN, WSiN, WBN, ZrAlN, TaSiN, TaAlN, Ti, W, Ta, Pt, TiSi, TaSi, TiW, TiAlON, WON, TaON and IrO$_2$.

Figure 5B:
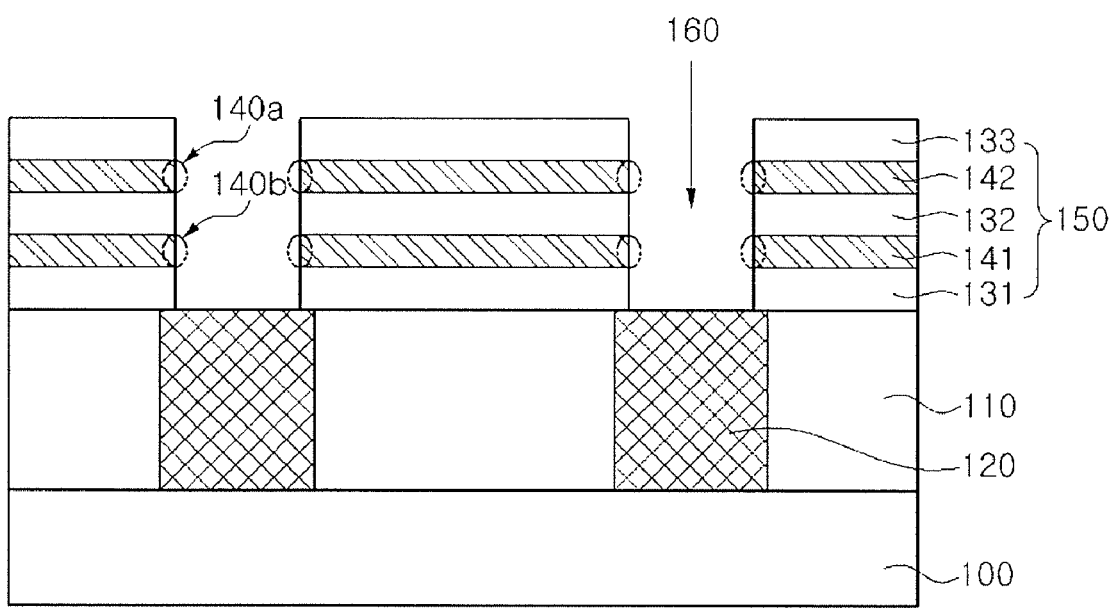

As shown in FIG. 5B, the first insulating film 131, the first silicon film 141, the second insulating film 132, the second silicon film 142 and the third insulating film 133 are sequentially deposited over the nitride film 110 that has the lower electrodes 120 to form the laminated interlayer film 150. The first, second and third insulating films 131, 132, 133 are deposited with any one selected from the group consisting of USG, PSG, BPSG, SOG, TEOS and HDP.

Subsequently, the third insulating film 133, the second silicon film 142, the second insulating film 132, the first silicon film 141 and the first insulating film 131 are sequentially etched to form the holes 160 for exposing the surface of the lower electrodes 120. While the holes 160 are formed the surface 140a of the first silicon film 141 and the surface 140b of the second silicon film 142 are exposed. The holes 160 correspond to a region for forming a subsequent phase change layer.

Figure 5C:
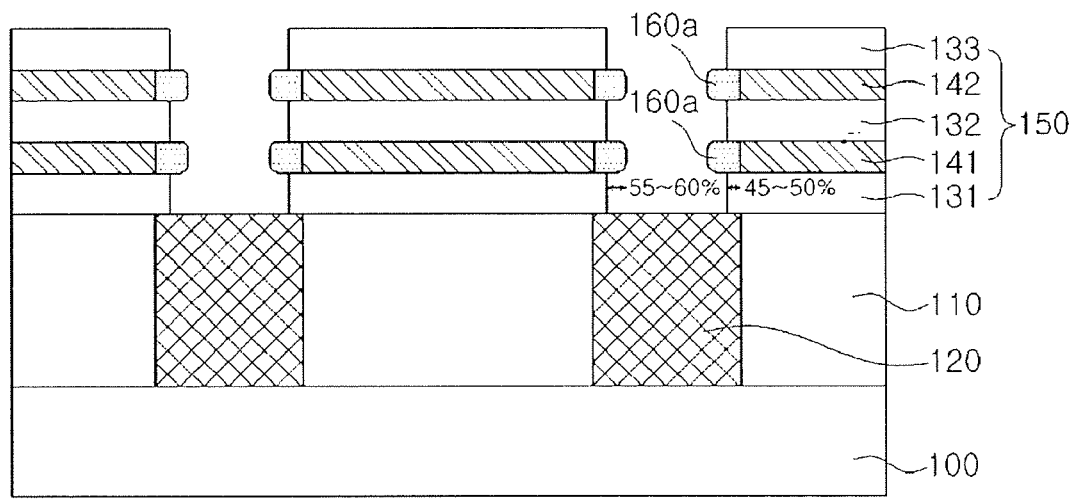

As shown in FIG. 5C, the semiconductor substrate having the holes 160 is then subsequently subjected to an oxidation process. In the oxidation process, the exposed surface 140a of the first silicon film and the exposed surface 140b of the second silicon film are oxidized and converted into the silicon oxide layer 160a. Preferably, the oxidation process is performed so that volume expansion occurs as much as about 55~60% inwards towards the interlayer film 150 and as much as about 40~45% within the confines of the holes from the exposed surfaces 140a, 140b of the first and second silicon films.

As a result the silicon oxide layer 160a provides a bottleneck insulator shape around the internal circumference of the holes. As a result the effective electrical width of the holes where phase change occurs may be reduced which thus ensures a lower working reset current.

Figure 5D:
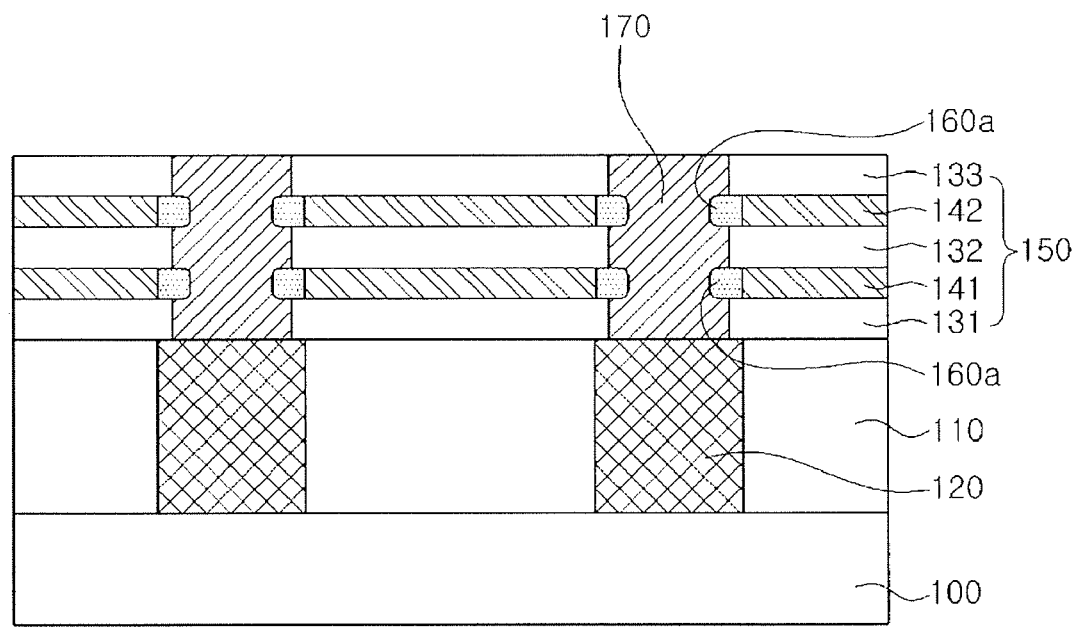

As shown in FIG. 5D, the phase change layer 170 is embedded within the holes 160 having the silicon oxide layer 160a. The phase change layer 170 is made of a mixture or alloy containing one or more selected from the group consisting of Te, Se, Ge, Sb, Bi, Pb, Sn, As, S, Si, P and O. Preferably, a ternary compound of Ge, Sb and Te or a quaternary compound of In, Sb, Te and Ag may be used. Also, the phase change layer 170 may be embedded within the holes 160 by using any one process selected from the group consisting of ALD, CVD and selective growth.

The phase change layer 170 is then subsequently subjected to a flattening process to expose the third insulating film 133. The flattening process may be conducted using either CMP or etch-back techniques.

Figure 5E:
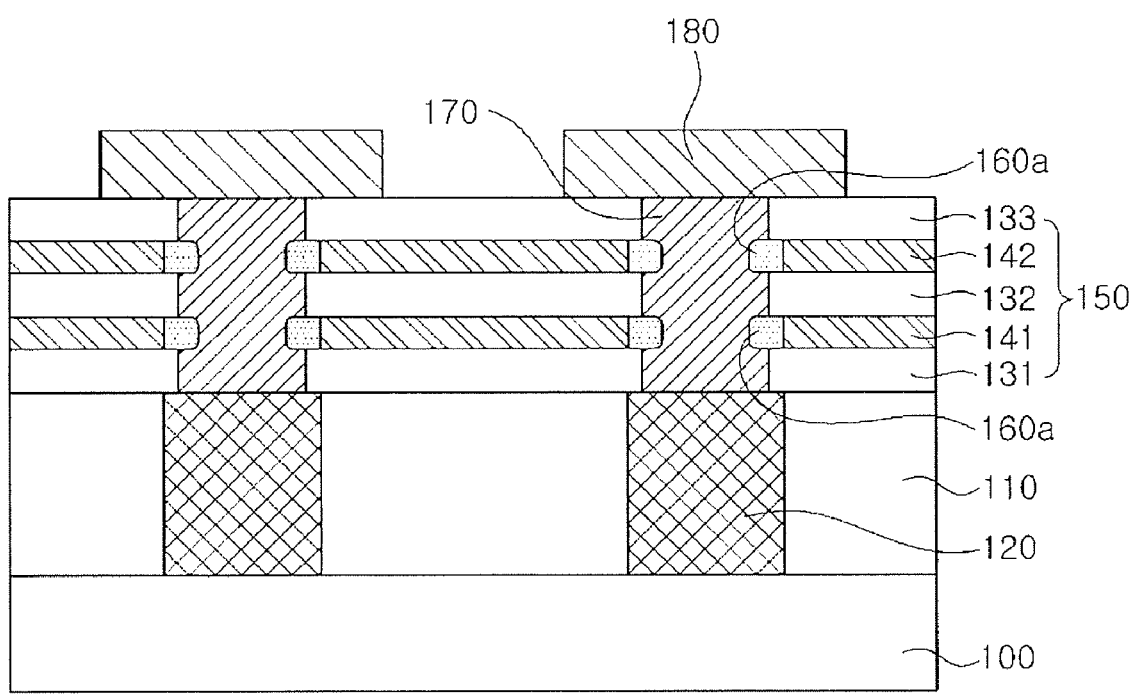

As shown in FIG. 5E, an upper electrode material is then deposited on the third insulating film 133 which has the phase change layer 170. After which the upper electrode material is selectively etched away to form the upper electrodes 180 on the phase change layer 170. The upper electrodes 180 are formed of any one selected from the group consisting of TiN, TaN, WN, MoN, NbN, TiSiN, TiAlN, TiBN, ZrSiN, WSiN, WBN, ZrAlN, MoSiN, MoAlN, TaSiN, TaAlN, W, Ti, Me, Ta, Pt, TiSi, TaSi, TiW, TiON, TiAlON, WON, TaON, and IrO$_2$.

Although not shown, a series of subsequent procedures which are known in the art are sequentially performed, thus completing the phase change memory device according to the second embodiment of the present invention.

In yet another embodiment of the present invention, the oxidation process is performed in a state in which the holes are already formed, so that the exposed surfaces of the first and second silicon films are converted into the silicon oxide layer, thus forming the insulators including the silicon oxide layer along the inner walls of the holes. In addition, according to a modification of this embodiment, a selective SEG may be performed to a state in which the holes are already formed to form an epi-silicon layer on the exposed surfaces of the first and second silicon films. After which the oxidation process may be performed, so that the epi-silicon layer is subsequently converted into the silicon oxide layer to form the insulators including the silicon oxide layer along the inner walls of the holes.

Figure 6A:
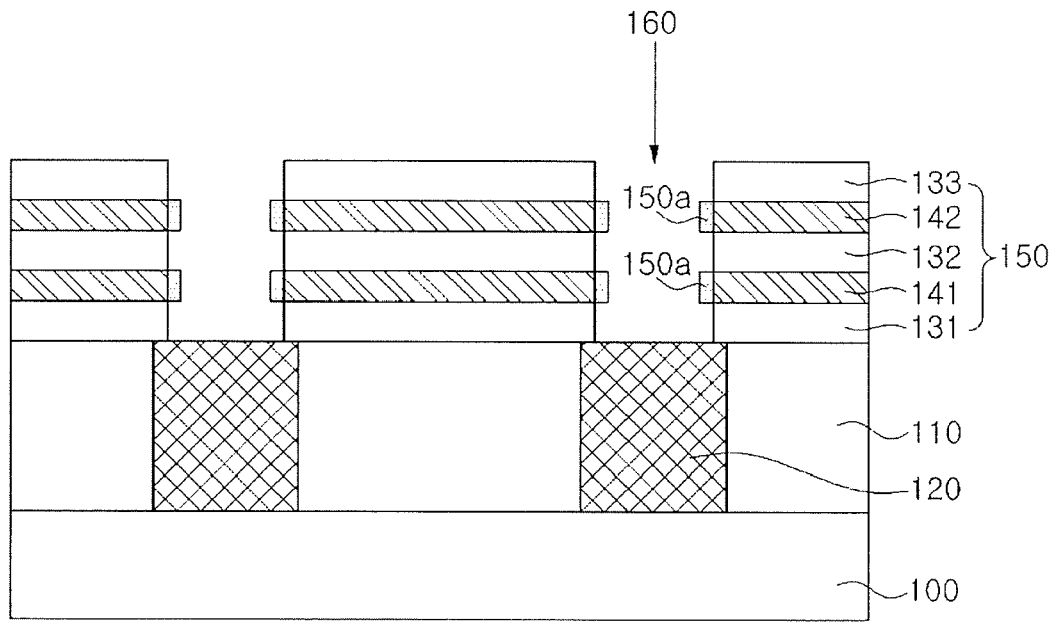
FIGS. 6A and 6B are cross-sectional views showing a process of manufacturing a phase change memory device according to a modification of the second embodiment of the present invention.
Figure 6B:
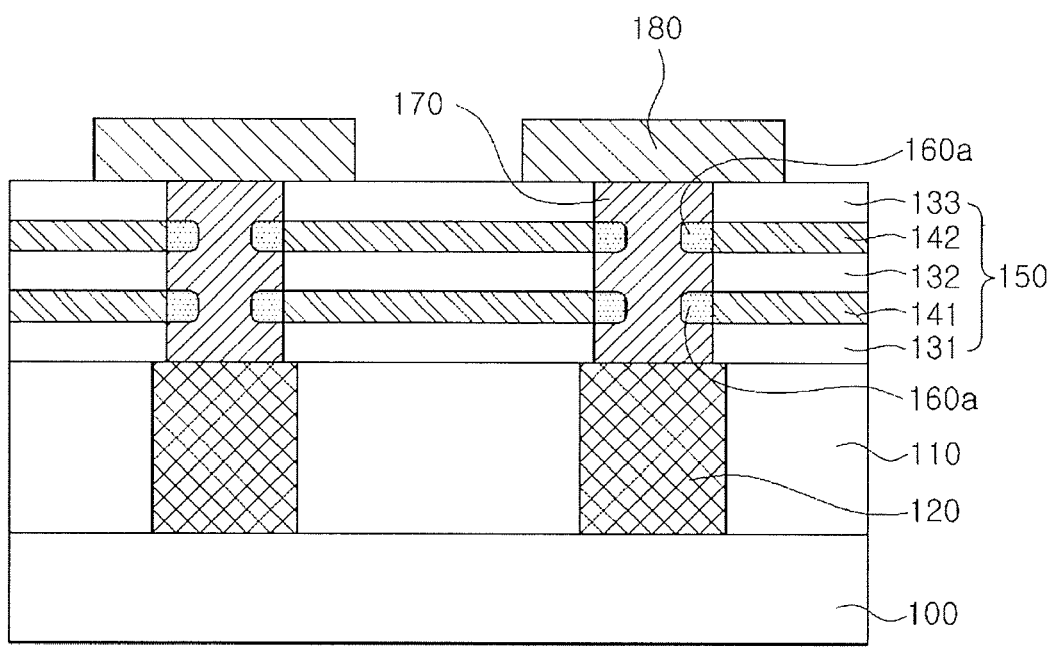

FIGS. 6A and 6B are cross-sectional views showing the process of manufacturing the phase change memory device according to the modification of the second embodiment of the present invention. In the modification of the second embodiment of the present invention, all of the process steps are performed in the same manner as in the second embodiment, with the exception that SEG for forming the epi-silicon layer is further performed. Thus, a redundant description for the same elements is omitted, and the same elements are designated by the same names and reference numerals.

As shown in FIG. 6A, an interlayer film 150 is etched, thus forming holes 160, after which a semiconductor substrate having the holes 160 is subjected to a selective SEG coating process. In doing so a silicon layer selectively grows on the exposed surfaces of first and second silicon films and an epi-silicon layer 150a is formed on the exposed surfaces of the first and second silicon films.

As shown in FIG. 6B, the semiconductor substrate having the epi-silicon layer 150a is then subjected to an oxidation process which converts the epi-silicon layer into a silicon oxide layer 160a.

Thereafter, a series of subsequent procedures including forming a phase change layer 170 and forming upper electrodes 180 are sequentially performed, thus completing the phase change memory device according to the modification of the second embodiment of the present invention.

In the modification of this embodiment, the silicon oxide layer 160a formed from the SEG and oxidized as above, the insulation bottlenecks along the inner circumference of the holes may be formed in order to further narrow the width of the holes which ultimately ensure a lower working reset current.

Although not shown, a series of subsequent procedures which are known in the art are sequentially performed, thus completing the phase change memory device according to the modification of the second embodiment of the present invention.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A phase change memory device, comprising:
   a semiconductor substrate;
   a lower electrode formed over the semiconductor substrate;
   an interlayer film formed over the semiconductor substrate having the lower electrode, the interlayer film including a laminate of a first insulating film, a silicon film and a second insulating film, and a hole formed therethrough;
   an insulator disposed along a surface of the silicon film exposed by the hole;
   a phase change layer embedded within the hole having the insulator; and
   an upper electrode formed over the phase change layer.

2. The phase change memory device as set forth in claim 1, wherein the lower electrode comprises any one selected from the group consisting of TiN, WN, MoN, NbN, TiSiN, TiAlN, TiBN, ZrSiN, WSiN, WBN, ZrAlN, TaSiN, TaAlN, Ti, W, Ta, Pt, TiSi, TaSi, TiW, TiAlON, WON, TaON and IrO$_2$.

3. The phase change memory device as set forth in claim 1, wherein the first insulating film comprises any one selected from the group consisting of undoped silicate glass (USG), phosphorus silicate glass (PSG), boron phosphorus silicate glass (BPSG), spin on glass (SOG), tetra ethyl orthosilicate (TEOS) and high density plasma (HDP).

4. The phase change memory device as set forth in claim 1, wherein the second insulating film comprises any one selected from the group consisting of undoped silicate glass (USG), phosphorus silicate glass (PSG), boron phosphorus silicate glass (BPSG), spin on glass (SOG), tetra ethyl orthosilicate (TEOS) and high density plasma (HDP).

5. The phase change memory device as set forth in claim 1, wherein the insulator comprises a silicon oxide layer.

6. The phase change memory device as set forth in claim 1, wherein the phase change layer is formed of a mixture or alloy containing one or more selected from the group consisting of Te, Se, Ge, Sb, Bi, Pb, Sn, As, S, Si, P and O.

7. The phase change memory device as set forth in claim 1, wherein the upper electrode is formed of any one selected from the group consisting of TiN, TaN, WN, MoN, NbN, TiSiN, TiAlN, TiBN, ZrSiN, WSiN, WBN, ZrAlN, MoSiN, MoAlN, TaSiN, TaAlN, W, Ti, Mo, Ta, Pt, TiSi, TaSi, TiW, TiON, TiAlON, WON, TaON, and IrO$_2$.

8. A phase change memory device, comprising:
   a semiconductor substrate;
   a lower electrode formed over the semiconductor substrate;
   an interlayer film formed over the semiconductor substrate having the lower electrode, the interlayer film including a laminate of a first insulating film, a first silicon film, a second insulating film, a second silicon film and a third insulating film, and a hole formed therethrough;
   insulators disposed along a surface of the first silicon film and a surface of the second silicon film which are exposed by the hole;
   a phase change layer embedded in the hole having the insulators; and
   an upper electrode formed on the phase change layer.

9. The phase change memory device as set forth in claim 8, wherein the lower electrode comprises any one selected from the group consisting of TiN, WN, MoN, NbN, TiSiN, TiAlN, TiBN, ZrSiN, WSiN, WBN, ZrAlN, TaSiN, TaAlN, Ti, W, Ta, Pt, TiSi, TaSi, TiW, TiAlON, WON, TaON and IrO$_2$.

10. The phase change memory device as set forth in claim 8, wherein the first insulating film comprises any one selected from the group consisting of undoped silicate glass (USG), phosphorus silicate glass (PSG), boron phosphorus silicate glass (BPSG), spin on glass (SOG), tetra ethyl orthosilicate (TEOS) and high density plasma (HDP).

11. The phase change memory device as set forth in claim 8, wherein the second insulating film comprises any one selected from the group consisting of undoped silicate glass (USG), phosphorus silicate glass (PSG), boron phosphorus silicate glass (BPSG), spin on glass (SOG), tetra ethyl orthosilicate (TEOS) and high density plasma (HDP).

12. The phase change memory device as set forth in claim 8, wherein the third insulating film comprises any one selected from the group consisting of undoped silicate glass (USG), phosphorus silicate glass (PSG), boron phosphorus silicate glass (BPSG), spin on glass (SOG), tetra ethyl orthosilicate (TEOS) and high density plasma (HDP).

13. The phase change memory device as set forth in claim 8, wherein the insulators comprise a silicon oxide layer.

14. The phase change memory device as set forth in claim 8, wherein the phase change layer is formed of a mixture or alloy containing one or more selected from the group consisting of Te, Se, Ge, Sb, Bi, Pb, Sn, As, S, Si, P and O.

15. The phase change memory device as set forth in claim 8, wherein the upper electrode is formed of any one selected from the group consisting of TiN, TaN, WN, MoN, NbN, TiSiN, TiAlN, TiBN, ZrSiN, WSiN, WBN, ZrAlN, MoSiN, MoAlN, TaSiN, TaAlN, W, Ti, Mo, Ta, Pt, TiSi, TaSi, TiW, TiON, TiAlON, WON, TaON, and IrO$_2$.

16. A method of manufacturing a phase change memory device, comprising:
   forming a nitride film over a semiconductor substrate;
   forming a lower electrode in the nitride film;
   laminating a first insulating film, a silicon film and a second insulating film on the nitride film having the lower electrode;
   etching the second insulating film, the silicon film and the first insulating film to form a hole that exposes a surface of the lower electrode;
   subjecting the semiconductor substrate having the hole to oxidation to convert a surface of the silicon film exposed by the hole into a silicon oxide layer;
   forming a phase change layer embedded within the hole having the silicon oxide layer; and
   forming an upper electrode over the phase change layer.

17. The method as set forth in claim 16, wherein the lower electrode comprises any one selected from the group consisting of TiN, WN, MoN, NbN, TiSiN, TiAlN, TiBN, ZrSiN, WSiN, WBN, ZrAlN, TaSiN, TaAlN, Ti, W, Ta, Pt, TiSi, TaSi, TiW, TiAlON, WON, TaON and IrO$_2$.

18. The method as set forth in claim 16, wherein the first insulating film comprises any one selected from the group consisting of undoped silicate glass (USG), phosphorus silicate glass (PSG), boron phosphorus silicate glass (BPSG), spin on glass (SOG), tetra ethyl orthosilicate (TEOS) and high density plasma (HDP).

19. The method as set forth in claim 16, wherein the second insulating film comprises any one selected from the group consisting of undoped silicate glass (USG), phosphorus silicate glass (PSG), boron phosphorus silicate glass (BPSG), spin on glass (SOG), tetra ethyl orthosilicate (TEOS) and high density plasma (HDP).

20. The method as set forth in claim 16, further comprising subjecting the semiconductor substrate having the hole to selective silicon epitaxial growth process to form an epi-silicon layer on the surface of the silicon film, between the steps of forming the hole and converting the surface of the silicon film exposed by the hole into the silicon oxide layer.

21. The method as set forth in claim 16, wherein the formed silicon oxide layer has about 55~60% of the thickness of the formed silicon oxide layer extending into the laminated silicon film has about 40~45% of the thickness of the formed silicon oxide layer extending within the hole.

22. The method as set forth in claim 16, wherein the forming the phase change layer is performed using a mixture or alloy containing one or more selected from the group consisting of Te, Se, Ge, Sb, Bi, Pb, Sn, As, S, Si, P and O.

23. The method as set forth in claim 16, wherein the forming the phase change layer is performed through any one deposition technique selected from the group consisting of atomic layer deposition, chemical vapor deposition and selective growth.

24. The method as set forth in claim 16, wherein the forming the upper electrode is performed using any one selected from the group consisting of TiN, TaN, WN, MoN, NbN, TiSiN, TiAlN, TiBN, ZrSiN, WSiN, WBN, ZrAlN, MoSiN, MoAlN, TaSiN, TaAlN, W, Ti, Me, Ta, Pt, TiSi, TaSi, TiW, TiON, TiAlON, WON, TaON, and IrO$_2$.

25. A method of manufacturing a phase change memory device, comprising:
   forming a nitride film over a semiconductor substrate;
   forming a lower electrode in the nitride film;
   laminating a first insulating film, a first silicon film, a second insulating film, a second silicon film and a third insulating film over the nitride film having the lower electrode;
   etching the third insulating film, the second silicon film, the second insulating film, the first silicon film and the first insulating film to form a hole that exposes a surface of the lower electrode;
   subjecting the semiconductor substrate having the hole to oxidation to oxidize a surface of the first silicon film and a surface of the second silicon film which are exposed by the hole into a first and second silicon oxide layer around an inner circumference of the hole;
   forming a phase change layer embedded within the hole having the first and second silicon oxide layer; and
   forming an upper electrode over the phase change layer.

26. The method as set forth in claim 25, wherein the lower electrode comprises any one selected from the group consisting of TiN, WN, MoN, NbN, TiSiN, TiAlN, TiBN, ZrSiN, WSiN, WBN, ZrAlN, TaSiN, TaAlN, Ti, W, Ta, Pt, TiSi, TaSi, TiW, TiAlON, WON, TaON and IrO$_2$.

27. The method as set forth in claim 25, wherein the first insulating film comprises any one selected from the group consisting of undoped silicate glass (USG), phosphorus silicate glass (PSG), boron phosphorus silicate glass (BPSG), spin on glass (SOG), tetra ethyl orthosilicate (TEOS) and high density plasma (HDP).

28. The method as set forth in claim 25, wherein the second insulating film comprises any one selected from the group consisting of undoped silicate glass (USG), phosphorus silicate glass (PSG), boron phosphorus silicate glass (BPSG), spin on glass (SOG), tetra ethyl orthosilicate (TEOS) and high density plasma (HDP).

29. The method as set forth in claim 25, wherein the third insulating film comprises any one selected from the group consisting of undoped silicate glass (USG), phosphorus silicate glass (PSG), boron phosphorus silicate glass (BPSG), spin on glass (SOG), tetra ethyl orthosilicate (TEOS) and high density plasma (HDP).

30. The method as set forth in claim 25, further comprising subjecting the semiconductor substrate having the hole to a selective silicon epitaxial growth process to form epi-silicon layers on the surfaces of the first and second silicon films and oxidizing the surfaces of the epi-silicon layers on the surfaces of the first and second silicon films into respective first and second silicon oxide layers.

31. The method as set forth in claim 25, wherein the first and second silicon oxide layers extend about 55~60% into the respective first and second silicon layer of the laminate and extend about 40~45% in the hole.

32. The method as set forth in claim 25, wherein the forming the phase change layer is performed using a mixture or alloy containing one or more selected from the group consisting of Te, Se, Ge, Sb, Bi, Pb, Sn, As, S, Si, P and O.

33. The method as set forth in claim 25, wherein the forming the phase change layer is deposited by any one deposition techniques selected from the group consisting of atomic layer deposition, chemical vapor deposition and selective growth.

34. The method as set forth in claim 25, wherein the forming the upper electrode is performed using any one selected from the group consisting of TiN, TaN, WN, MoN, NbN, TiSiN, TiAlN, TiBN, ZrSiN, WSiN, WBN, ZrAlN, MoSiN, MoAlN, TaSiN, TaAlN, W, Ti, Mo, Ta, Pt, TiSi, TaSi, TiW, TiON, TiAlON, WON, TaON, and IrO$_2$.

* * * * *